United States Patent
Golden et al.

(10) Patent No.: US 9,754,914 B1
(45) Date of Patent: Sep. 5, 2017

(54) METHOD TO PROVIDE DIE ATTACH STRESS RELIEF USING GOLD STUD BUMPS

(71) Applicant: Rosemount Aerospace Inc., Burnsville, MN (US)

(72) Inventors: Jim Golden, Afton, MN (US); David Barwig, Plymouth, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 15/151,160

(22) Filed: May 10, 2016

(51) Int. Cl.
| | |
|---|---|
| *H01L 21/56* | (2006.01) |
| *H01L 23/00* | (2006.01) |
| *H01L 21/48* | (2006.01) |
| *H01L 23/498* | (2006.01) |

(52) U.S. Cl.
CPC .......... *H01L 24/81* (2013.01); *H01L 21/4853* (2013.01); *H01L 23/49811* (2013.01); *H01L 2224/8192* (2013.01); *H01L 2224/81192* (2013.01); *H01L 2224/81444* (2013.01); *H01L 2224/81491* (2013.01); *H01L 2224/81862* (2013.01); *H01L 2924/0715* (2013.01); *H01L 2924/1433* (2013.01); *H01L 2924/2064* (2013.01); *H01L 2924/20105* (2013.01); *H01L 2924/20641* (2013.01); *H01L 2924/20642* (2013.01); *H01L 2924/3511* (2013.01)

(58) Field of Classification Search
CPC ....... H01L 2924/00; H01L 2924/00014; H01L 2224/73204
See application file for complete search history.

(56) References Cited

U.S. PATENT DOCUMENTS

| | | | | |
|---|---|---|---|---|
| 5,969,461 A | * | 10/1999 | Anderson | ............... H01L 24/32 174/260 |
| 6,081,038 A | * | 6/2000 | Murayama | ............ H01L 21/563 257/783 |
| 6,223,429 B1 | * | 5/2001 | Kaneda | ............... H01L 23/3121 174/260 |
| 6,297,562 B1 | * | 10/2001 | Tilly | ....................... H01L 24/16 257/738 |
| 7,838,988 B1 | | 11/2010 | Gurrum et al. | |
| 7,880,287 B1 | | 2/2011 | Samuel et al. | |
| 8,129,224 B2 | | 3/2012 | Gurrum et al. | |
| 2003/0071348 A1 | * | 4/2003 | Eguchi | .................... H01L 21/56 257/723 |
| 2004/0178488 A1 | * | 9/2004 | Bolken | ............... H01L 23/3128 257/686 |

(Continued)

OTHER PUBLICATIONS

Yoshihiro Yoneda et al., "A Novel Flip Chip Bonding Technology Using Au Stud Bump and Lead-free Solder", San-Pacific Conference, 1999.

(Continued)

*Primary Examiner* — Jaehwan Oh

(74) *Attorney, Agent, or Firm* — Kinney & Lange, P.A.

(57) ABSTRACT

An integrated circuit is attached to a substrate with a controlled stand-off height, by mounting a plurality of stud bumps of the controlled stand-off height to the substrate at predetermined locations, placing adhesive dots over the stud bumps, placing the integrated circuit on the substrate over the adhesive dots, and applying downward pressure on the integrated circuit until the integrated circuit is in mechanical contact with the stud bumps.

7 Claims, 3 Drawing Sheets

(56) References Cited

U.S. PATENT DOCUMENTS

| | | | | |
|---|---|---|---|---|
| 2005/0282411 A1* | 12/2005 | Fork | .................... | G01R 1/0466 |
| | | | | 439/74 |
| 2006/0261364 A1* | 11/2006 | Suehiro | .................. | H01L 33/56 |
| | | | | 257/100 |
| 2006/0281203 A1* | 12/2006 | Epler | ................. | H01L 33/0079 |
| | | | | 438/22 |
| 2010/0301470 A1 | 12/2010 | Gurrum et al. | | |
| 2013/0062761 A1* | 3/2013 | Lin | .................. | H01L 23/49816 |
| | | | | 257/738 |
| 2014/0254124 A1* | 9/2014 | Raje | ........................ | B23K 1/06 |
| | | | | 361/808 |
| 2015/0102390 A1* | 4/2015 | Liu | ...................... | H01L 27/092 |
| | | | | 257/254 |
| 2015/0194409 A1* | 7/2015 | Chuang | .............. | H01L 25/0657 |
| | | | | 257/737 |
| 2016/0218264 A1* | 7/2016 | Tischler | ................. | H01L 24/75 |

OTHER PUBLICATIONS

Rekha S. Pai, Mark M. Crain, Kevin M. Walsh, "Maskless Shaping of Gold Stud Bumps as High Aspect Ration Microstructures", Microelectronic Engineering 88, (2011), pp. 135-139.

Sang-Su Ha and Seung-Boo Jung, "Thermal and Mechanical Properties of Flip Chip Package with Au Stud Bump", Materials Transactions, vol. 54, No. 6 (2013), pp. 905-910.

* cited by examiner

METHOD TO PROVIDE DIE ATTACH STRESS RELIEF USING GOLD STUD BUMPS

BACKGROUND

A number of issues affect the performance of a high density microelectronic package. Many of these are related to die attach technology. One example is thermal management, and particularly concerns over thermal heating and stress due to differences in the coefficient of thermal expansion (CTE) in different adjacent materials assembled in the package. Internal stress at the chip level as well as at the circuit board level can affect the electronic performance of a microelectronic package.

MEMS and IC devices may require stress relief for die attach at the device level as well as at the board level. Stress relief may be achieved by mechanical compliance at the attachment points. Examples of mechanically compliant adhesives are silicones, epoxies, and polyimides. Silicone adhesives are popular compliant prior art die and board attach adhesives and may be employed in the form of silicone dots positioned at attachment points. If stand-off is an issue, silicone dots alone may not control the stand-off of a device from a substrate. If the stand-off provided by the silicone dots varies, the stress imparted to the die or board may vary by how much silicone touches the back side of the device. A prior art method to control the stand-off height is to incorporate glass beads in the silicone adhesive. An improved method to control the stand-off with silicone dot adhesives for die attach would be helpful.

SUMMARY

An integrated circuit is attached to a substrate with a controlled stand-off height, by mounting a plurality of stud bumps of the controlled stand-off height to the substrate at predetermined locations, placing adhesive dots over the stud bumps, placing the integrated circuit on the substrate over the adhesive dots, and applying downward pressure on the integrated circuit until the integrated circuit is in mechanical contact with the stud bumps.

An attachment feature for an integrated circuit on a substrate provides a controlled stand-off height. The attachment feature includes a plurality of stud bumps on the substrate, and a plurality of adhesive dots covering the stud bumps. The plurality of stud bumps and the plurality of adhesive dots on the substrate are configured to attach the integrated circuit to the substrate at the controlled stand-off height determined by heights of the stud bumps upon pressing down of the integrated circuit on the adhesive dots to achieve physical contact between the substrate and the stud bumps.

DETAILED DESCRIPTION

A non-limiting method to control the stand-off distance during die attach of a MEMS, IC or circuit board to a substrate is to insert a rigid core with a specific height in the adhesive before attachment. In an embodiment, the rigid core of the present disclosure may be a stud bump. The stud bumps may be formed using any stud bumping machine and method known in the art. An example of a stud bumping operation may include melting an end of a wire of a desired stud bump material to form a ball on the end of the wire. The stud bumping apparatus may then bond the ball onto a package substrate. The wire is then cut close to the ball, leaving the stud bump. The total height of the stud bumps may be varied by adding stud bumps to the initial stud bump until a predetermined stand-off height is reached.

Figure 1:
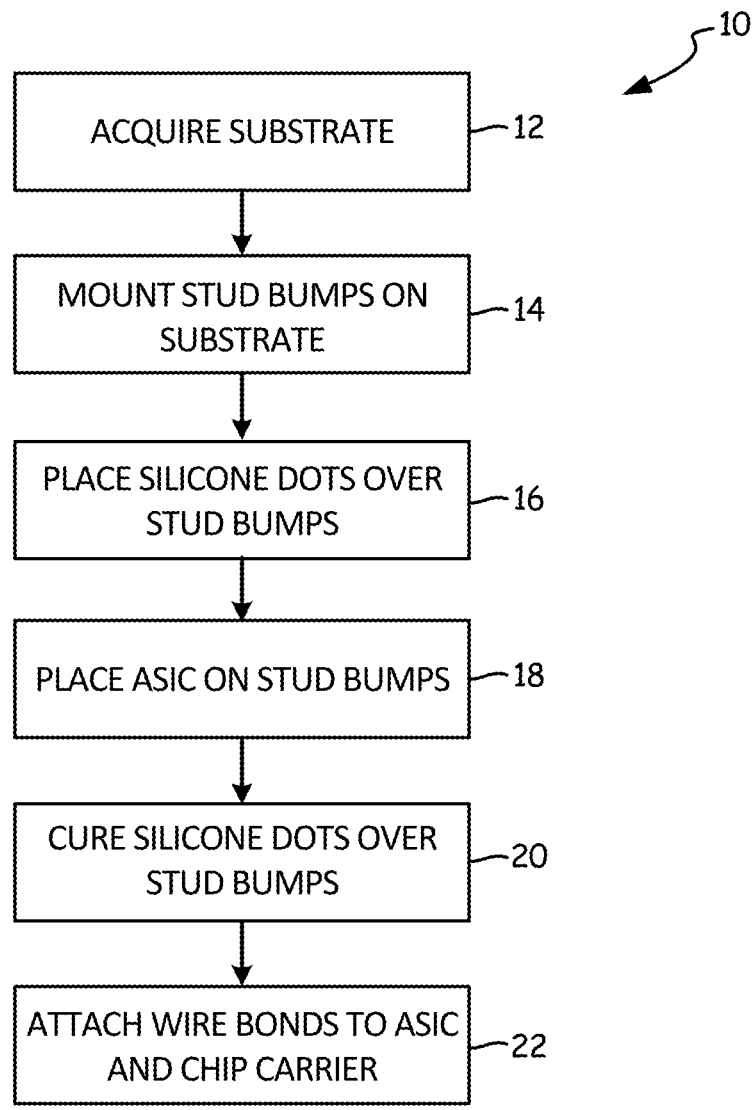
FIG. 1 is a flow diagram of a die attach process using stud bumps.

FIG. 1 is a flow diagram of die attach assembly process 10 using stud bumps. First, a suitable substrate is acquired (step 12). Stud bumps may then be mounted on the substrate at predetermined positions on the substrate at predetermined heights (step 14). Next, silicone adhesive dots may be placed on the stud bumps (step 16). In other embodiments, other polymer adhesives known in the art may be used. In an embodiment an application specific integrated circuit (ASIC) may then be placed on the substrate containing the stud bumps and silicone adhesive dots (step 18). The ASIC may be pressed down to cause physical contact between the ASIC and the stud bumps, with the silicon adhesive dots being forced to the sides to laterally surround the location where the ASIC and the stud bumps contact one another. The stud bumps and silicone adhesive dots together provide adhesion (due to the silicon adhesive dots) and a consistent stand-off height (due to the stud bumps) between the substrate and the ASIC attached thereto. The silicone adhesive may then be thermally cured by heating the assembly to about 150° C. (step 20). In the last step, wire bonds may then be made from the ASIC to contacts on the substrate (step 20).

Figure 2:
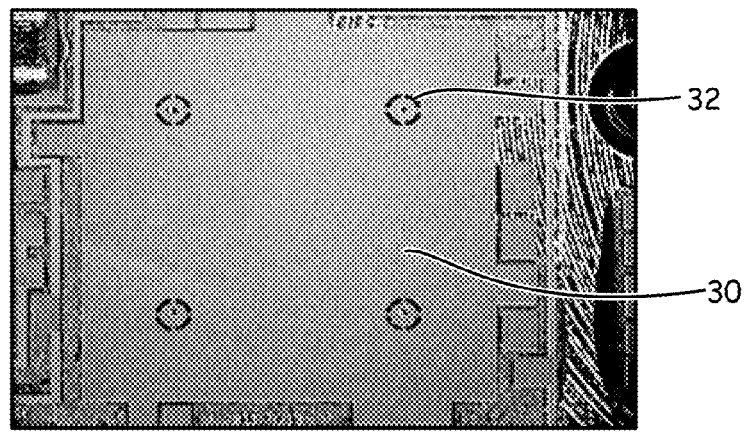
FIG. 2 is a top view photograph of a substrate with stud bumps mounted on the substrate.
Figure 3:
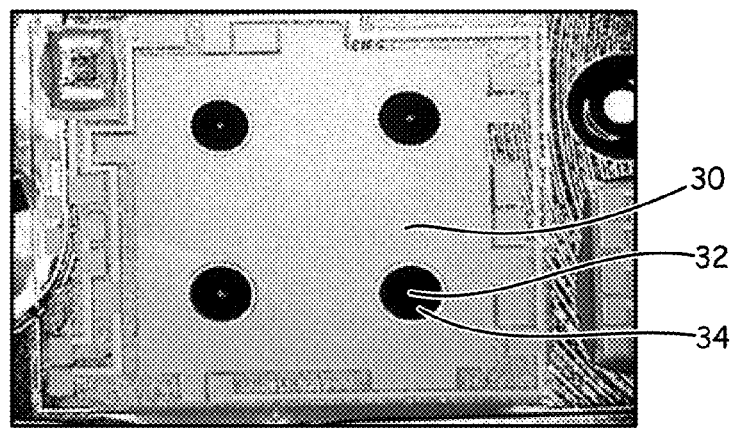
FIG. 3 is a top view photograph of the substrate with silicone dots over the stud bumps.
Figure 4:
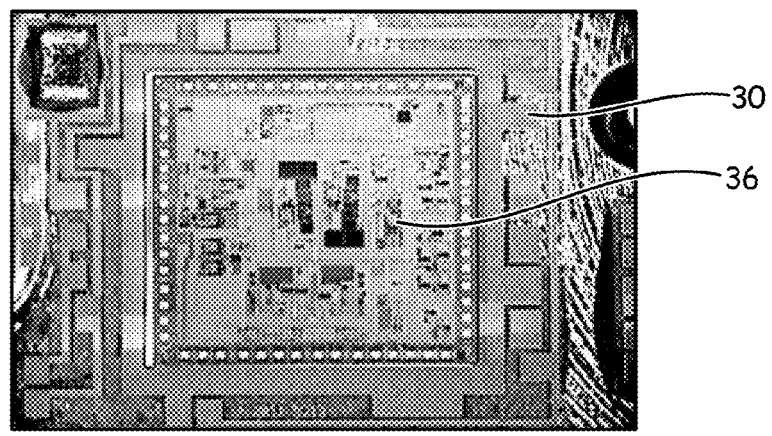
FIG. 4 is a top view photograph of an ASIC placed on top of the silicone dots and stud bumps on the substrate.
Figure 5:
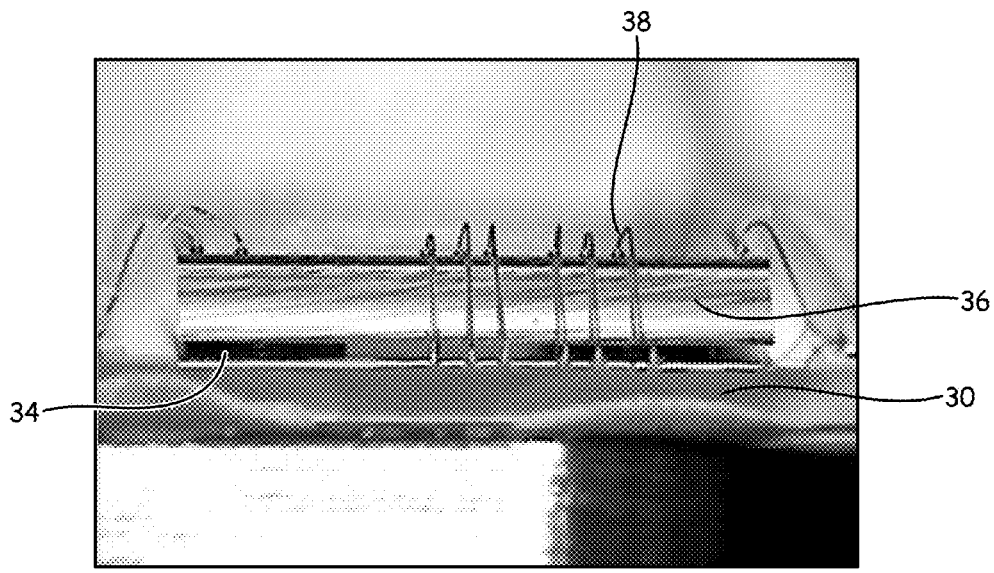
FIG. 5 is a side view photograph of the ASIC showing the stand-off height and wire bonds.

FIG. 2 is a top view photograph of substrate 30 on which four stud bumps 32 are mounted in preparation for bonding an ASIC to substrate 30 (step 14 of FIG. 1). FIG. 3 is a top view photograph of substrate 30 on which silicone adhesive dots 34 are placed on stud bumps 32 (step 16 of FIG. 1). FIG. 4 is a top view photograph of substrate 30 in which ASIC 36 is placed on stud bumps 32 and silicone adhesive dots 34 (not visible in FIG. 4) (step 18 of FIG. 1). In an exemplary embodiment, ASIC 36 is about 150 mils (3.8 mm) on a side. FIG. 5 is a side view photograph of substrate 30 showing the stand-off height between substrate 30 and ASIC 36 provided by stud bumps 32 (not visible in FIG. 5) and silicone adhesive dots 34 that laterally surround the stud bumps. Wire bonds 38 are provided to make electrical contacts from ASIC 36 to substrate 30.

Figure 6:
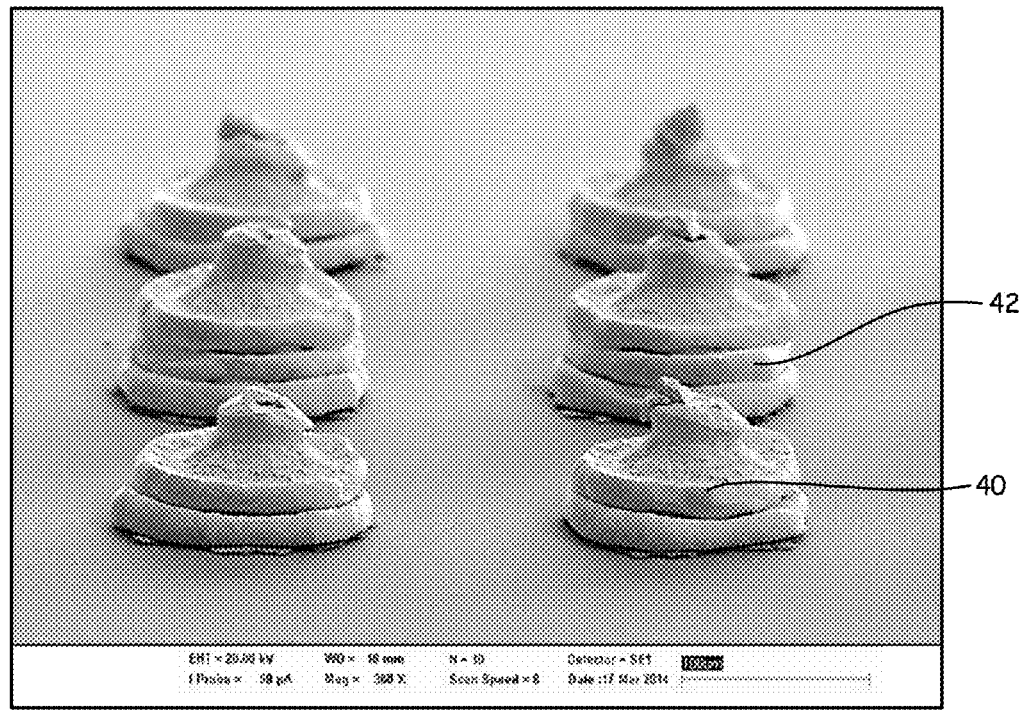
FIG. 6 is a scanning electron micrograph of multiple stud bumps formed on a substrate, to illustrate possible stand-off heights that can be achieved by stacking multiple stud bumps on top of one another.

FIG. 6 is a scanning electron micrograph of multiple stud bumps formed on a substrate, to illustrate possible stand-off heights that can be achieved by stacking multiple stud bumps on top of one another. In an exemplary embodiment, each stud bump may be formed from 1 mil (25.4 microns) gold wires and may be bonded to a substrate by a thermosonic ball bonder. As shown in FIG. 6, multiple stud bump 40 is formed by vertically stacking two stud bumps, thereby providing a stand-off height of 2 mils (50.8 microns), and multiple stud bump 42 is formed by vertically stacking three stud bumps, thereby providing a stand-off height of 3 mils (76.2 microns). In some embodiments, the total stand-off height provided by the stud bumps may be from 1 mils (25.4 microns) to 10 mils (254 microns). In other embodiments, the total stand-off height provided by the stud bumps may be from 2 mils (50.8 microns) to 4 mils (101.6 microns). In some embodiment, the stud bumps may be from 1 mil (25.4 microns) to 10 mils (254 microns) in diameter. In other embodiments, the stud bumps may be from 2 mils (50.8 microns) to 4 mils (101.6 microns) in diameter.

As a result of providing stud bumps on a substrate in the regions of silicone adhesive (such as gold stud bumps in an exemplary embodiment), consistent stand-off heights and locations can be provided through the use of auto ball bonders, without the need for special mixtures of glass beads and silicone adhesives. Consistent stand-off heights and repeatable contact area of silicone adhesive to a device (such as an ASIC) minimize stress and geometric variations in the electrical performance of the device. Wire bond connections to the device are also improved due to the Z axis stiffness provided by the stud bumps.

Discussion of Possible Embodiments

The following are non-exclusive descriptions of possible embodiments of the present invention.

A method of attaching an integrated circuit to a substrate with a controlled stand-off height may include: mounting a plurality of stud bumps of the controlled stand-off height to the substrate at predetermined locations; placing adhesive dots over the stud bumps; placing the integrated circuit on the substrate over the adhesive dots; applying downward pressure on the integrated circuit until the integrated circuit is in mechanical contact with the stud bumps; and thermally curing the adhesive.

The method of the preceding paragraph can optionally include, additionally and/or alternatively any, one or more of the following features, configurations and/or additional components:

The plurality of stud bumps may include multiple stud bumps stacked on top of one another at the predetermined locations.

The plurality of stud bumps may be made of gold.

The controlled stand-off height may be 1 mil (25.4 microns) to 10 mils (254 microns).

The controlled stand-off height may be 2 mils (50.8 microns) to 4 mils (101.6 microns).

The plurality of stud bumps may be 1 mil (25.4 microns) to 10 mils (254 microns) in diameter.

The plurality of stud bumps may 2 mils (50.8 microns) to 4 mils (101.6 microns) in diameter.

The adhesive dots may be silicone adhesive dots.

Thermally curing the adhesive may include heating to about 302° F. (150° C.).

An attachment feature for an integrated circuit on a substrate that provides a controlled stand-off height may include: a plurality of stud bumps on the substrate; and a plurality of adhesive dots covering the stud bumps; wherein the plurality of stud bumps and plurality of adhesive dots on the substrate may be configured to attach the integrated circuit to the substrate at the controlled stand-off height determined by heights of the stud bumps upon pressing down of the integrated circuit on the adhesive dots to achieve physical contact between the substrate and the stud bumps.

The feature of the preceding paragraph can optionally include, additionally and/or alternatively any, one or more of the following features, configurations and/or additional components:

The plurality of stud bumps may include multiple stud bumps stacked on top of one another.

The plurality of stud bumps may be made of gold.

The controlled stand-off height may be 1 mil (25.4 microns) to 10 mils (254 microns).

The controlled stand-of height may be 2 mils (50.8 microns) to 4 mils (101.6 microns).

The plurality of stud bumps may be 1 mil (25.4 microns) to 10 mils (254 microns) in diameter.

The plurality of stud bumps may be 2 mils (50.8 microns) to 4 mils (101.6 microns) in diameter.

The plurality of adhesive dots may be silicone adhesive dots.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An attachment feature for an integrated circuit on a substrate that provides a controlled stand-off height, comprising:
   a plurality of stud bumps on the substrate; and
   a plurality of silicone adhesive dots covering the stud bumps;
   wherein the plurality of stud bumps and the plurality of silicone adhesive dots on the substrate are configured to attach the integrated circuit to the substrate at the controlled stand-off height determined only by heights of the stud bumps upon pressing down of the integrated circuit on the silicone adhesive dots to achieve physical contact in contact locations between the integrated circuit and the stud bumps, the silicone adhesive dots being heated and thermally cured around the contact locations after pressing down of the integrated circuit to adhere the integrated circuit to the substrate.

2. The feature of claim 1, wherein the plurality of stud bumps includes multiple stud bumps stacked on top of one another.

3. The feature of claim 1, wherein the plurality of stud bumps are made of gold.

4. The feature of claim 1, wherein the controlled stand-off height is 1 mil (25.4 microns) to 10 mils (254 microns).

5. The feature of claim 4, wherein the controlled stand-off height is 2 mils (50.8 microns) to 4 mils (101.6 microns).

6. The feature of claim 1, wherein the plurality of stud bumps are 1 mil (25.4 microns) to 10 mils (254 microns) in diameter.

7. The feature of claim 6, wherein the plurality of stud bumps are 2 mils (50.8 microns) to 4 mils (101.6 microns) in diameter.

\* \* \* \* \*